United States Patent
Suyama et al.

(10) Patent No.: US 12,304,176 B2
(45) Date of Patent: May 20, 2025

(54) CONTINUOUS FIBER-REINFORCED SILICON CARBIDE MEMBER, MANUFACTURING METHOD THEREOF, AND NUCLEAR REACTOR STRUCTURAL MEMBER

(71) Applicants: KABUSHIKI KAISHA TOSHIBA, Minato-ku (JP); Toshiba Energy Systems & Solutions Corporation, Kawasaki (JP)

(72) Inventors: Shoko Suyama, Kawasaki (JP); Masaru Ukai, Yokohama (JP); Masayuki Uchihashi, Yokohama (JP); Kazuo Kakiuchi, Fujisawa (JP); Hideaki Heki, Yokohama (JP)

(73) Assignees: KABUSHIKI KAISHA TOSHIBA, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 255 days.

(21) Appl. No.: 15/968,885

(22) Filed: May 2, 2018

(65) Prior Publication Data
US 2018/0327327 A1  Nov. 15, 2018

(30) Foreign Application Priority Data
May 15, 2017  (JP) ................. 2017-096147

(51) Int. Cl.
*B32B 18/00* (2006.01)
*C04B 35/565* (2006.01)
(Continued)

(52) U.S. Cl.
CPC .......... *B32B 18/00* (2013.01); *C04B 35/565* (2013.01); *C04B 35/62873* (2013.01);
(Continued)

(58) Field of Classification Search
CPC .......... B32B 18/00; G21C 3/324; G21C 3/322
See application file for complete search history.

(56) References Cited

U.S. PATENT DOCUMENTS

| 5,079,039 A | 1/1992 | Heraud et al. |
| 6,217,997 B1 | 4/2001 | Suyama et al. |
| (Continued) | | |

FOREIGN PATENT DOCUMENTS

| CN | 103818056 A | 5/2014 |
| CN | 105405474 A | 3/2016 |
| (Continued) | | |

OTHER PUBLICATIONS

Wikipedia article on "Boron nitride", obtained on Jul. 2020.*
(Continued)

*Primary Examiner* — Holly Rickman
*Assistant Examiner* — Lisa Chau
(74) *Attorney, Agent, or Firm* — Oblon, McClelland, Maier & Neustadt, L.L.P.

(57) ABSTRACT

There are provided a continuous fiber-reinforced silicon carbide member and the like which allow sufficient improvement in a mechanical property and environmental resistance. The continuous fiber-reinforced silicon carbide member of an embodiment is a tubular shape and has a first composite material layer and a second composite material layer. In the first composite material layer, continuous fibers of silicon carbide are combined with a matrix of silicon carbide. In the second composite material layer, continuous fibers of carbon are combined with a matrix of silicon carbide. Then, the first composite material layer and the second composite material layer are stacked.

16 Claims, 14 Drawing Sheets

(51) Int. Cl.
| | |
|---|---|
| *C04B 35/628* | (2006.01) |
| *C04B 35/80* | (2006.01) |
| *C04B 35/83* | (2006.01) |
| *C04B 37/00* | (2006.01) |
| *C04B 41/00* | (2006.01) |
| *C04B 41/50* | (2006.01) |
| *C04B 41/85* | (2006.01) |
| *C04B 41/87* | (2006.01) |
| *C23C 16/04* | (2006.01) |
| *C23C 16/32* | (2006.01) |

(52) U.S. Cl.
CPC .............. *C04B 35/80* (2013.01); *C04B 35/83* (2013.01); *C04B 37/005* (2013.01); *C04B 41/009* (2013.01); *C04B 41/5001* (2013.01); *C04B 41/5024* (2013.01); *C04B 41/5061* (2013.01); *C04B 41/5062* (2013.01); *C04B 41/85* (2013.01); *C04B 41/87* (2013.01); *C23C 16/045* (2013.01); *C23C 16/32* (2013.01); *C23C 16/325* (2013.01); *C04B 2235/5244* (2013.01); *C04B 2235/5248* (2013.01); *C04B 2235/5264* (2013.01); *C04B 2235/614* (2013.01); *C04B 2235/94* (2013.01); *C04B 2237/08* (2013.01); *C04B 2237/083* (2013.01); *C04B 2237/086* (2013.01); *C04B 2237/365* (2013.01); *C04B 2237/38* (2013.01); *C04B 2237/55* (2013.01); *C04B 2237/70* (2013.01); *C04B 2237/704* (2013.01); *C04B 2237/708* (2013.01); *C04B 2237/765* (2013.01); *C04B 2237/84* (2013.01)

(56) References Cited

U.S. PATENT DOCUMENTS

| | | | |
|---|---|---|---|
| 6,226,342 B1 | 5/2001 | Micko et al. | |
| 6,277,493 B1 * | 8/2001 | Henager, Jr. | .......... C04B 37/005 |
| | | | 428/448 |
| 9,856,176 B2 * | 1/2018 | Harris | ................. C04B 35/5622 |
| 2011/0268243 A1 | 11/2011 | Hallstadius et al. | |
| 2013/0323150 A1 | 12/2013 | Jeon et al. | |
| 2014/0153688 A1 * | 6/2014 | Zabiego | ................... G21C 3/07 |
| | | | 376/409 |
| 2016/0049211 A1 | 2/2016 | Feinroth et al. | |
| 2016/0358673 A1 | 12/2016 | Xu et al. | |
| 2017/0057879 A1 * | 3/2017 | Harris | ................. C04B 35/5618 |
| 2017/0229195 A1 * | 8/2017 | Suyama | .................. G21C 3/322 |
| 2017/0330638 A1 | 11/2017 | Ishibashi et al. | |

FOREIGN PATENT DOCUMENTS

| | | | |
|---|---|---|---|
| EP | 0 385 869 A1 | 9/1990 | |
| EP | 3 174 063 A1 | 5/2017 | |
| JP | 4106086 | 6/2008 | |
| JP | 2016-24062 | 2/2016 | |
| JP | 2016024062 A * | 2/2016 | ............. G21C 3/322 |
| JP | WO 2016/084146 A1 | 6/2016 | |
| JP | 2016-135727 A | 7/2016 | |
| RU | 2 203-218 C2 | 4/2003 | |
| SE | 421733 B * | 1/1982 | ........... G21C 11/086 |
| WO | 2012/115348 A2 | 8/2012 | |
| WO | WO 2016/013207 A1 | 1/2016 | |
| WO | WO 2016/084146 A1 | 6/2016 | |

OTHER PUBLICATIONS

Padmavathi et al. "Carbon Fiber Reinforced Silicon Carbide Mini-Composites-Solution Approach." Journal of Materials Processing Technology, vol. 204, No. 1-3, 2008, pp. 434-439.*

Jung et al., "MAX Phase Modified SiC Composites for Ceramic-Metal Hybrid Cladding Tubes," Proceedings of the KNS 2015 Spring Meeting (2015).*

Arunajatesan, Sowmya, and H.H. Carim. "Symmetry and Crystal Structure of Ti3SIC2." Materials Letters, vol. 20, No. 5-6, 1994, abstract.*

Wikipedia article on "MAX phases", obtained on Jan. 2022.*

Padmavathi, N., et al. "Carbon fiber reinforced silicon carbide mini-composites-solution approach." Journal of Materials Processing Technology, vol. 204, No. 1-3, Aug. 2008, pp. 434-439, https://doi.org/10.1016/j.jmatprotec.2007.11.124.*

Guo, Shu Qi, et al. "Mechanical properties of short carbon fiber-reinforced SIC-matrix composites and correlation to fibers." Key Engineering Materials, vol. 512-515, Jun. 2012, pp. 798-803, https://doi.org/10.4028/www.scientific.net/kem.512-515.798.*

Youho Lee, et al., "A Structural Model for Multi-Layered Ceramic Cylinders and its Application to Silicon Carbide Cladding of Light Water Reactor Fuel" Journal of Nuclear Materials, vol. 458, 2015, pp. 87-105.

* cited by examiner

CONTINUOUS FIBER-REINFORCED SILICON CARBIDE MEMBER, MANUFACTURING METHOD THEREOF, AND NUCLEAR REACTOR STRUCTURAL MEMBER

CROSS REFERENCE TO RELATED APPLICATIONS

This application is based upon and claims the benefit of priority from Japanese Patent Application (Patent Application No. 2017-96147), filed on May 15, 2017; the entire contents of which are incorporated herein by reference.

FIELD

Embodiments described herein relate generally to a continuous fiber-reinforced silicon carbide member, a method thereof, and a nuclear reactor structural member.

BACKGROUND

In a silicon carbide member which is a ceramic material, in general, a decrease in strength is small in a high-temperature environment. In addition, the silicon carbide member has higher hardness and is more excellent in properties such as abrasion resistance, heat resistance, oxidation resistance, corrosion resistance, and lightness than a conventional metal member. Therefore, the silicon carbide member is in use in many fields. For example, as materials of heavy electrical equipment parts, aircraft parts, automotive parts, electronic devices, precision machinery parts, and semiconductor devices, the silicon carbide member is in use.

However, a silicon carbide monolithic member which is a silicon carbide member is more vulnerable to a tensile stress than to a compressive stress, and brittle fracture sometimes occurs when the tensile stress is applied thereto. Therefore, in order to enhance toughness more and increase fracture energy more than the silicon carbide monolithic member, a continuous fiber-reinforced silicon carbide member in which continuous fibers of silicon carbide are combined in a matrix of silicon carbide is under development as a silicon carbide member.

In manufacturing a continuous fiber-reinforced silicon carbide member 1, at first, for example, a fiber bundle (yarn) is formed by bundling 500 to 3000 continuous fibers of silicon carbide, each of which has a diameter of about 10 µm, thereafter forming a preform (fiber preform) with a predetermined shape by using the fiber bundle. The preform is formed by weaving the fiber bundles other than formed by arranging the fiber bundles in a two-dimensional direction or a three-dimensional direction.

Next, the continuous fiber-reinforced silicon carbide member is completed by forming a matrix inside the preform. The formation of the matrix is performed by a chemical vapor infiltration (CVI) method, for example. Further, the formation of the matrix is performed by performing reaction sintering after filling the inside of the preform with powder by a slip casting method. Other than this, the formation of the matrix is performed by a precursor infiltration and pyrolysis method (PIP method). In the precursor infiltration and pyrolysis method, for example, firing after infiltrating a ceramic precursor (polycarbosilane or the like) into the preform formed of ceramic fibers is repeated multiple times (for example, six to seven times), thereby forming the matrix.

As described above, in the silicon carbide member, the continuous fiber-reinforced silicon carbide member has higher toughness and larger fracture energy than the silicon carbide monolithic member, and seemingly, the brittle fracture does not easily occur. However, in general, the continuous fiber-reinforced silicon carbide member includes a 5 to 20 vol % pore. In particular, when the continuous fiber-reinforced silicon carbide member is produced by the chemical vapor infiltration method, silicon carbide ceramics with stoichiometric composition are formed at high purity but include the 5 to 20 vol % pore. Therefore, it is sometimes difficult to apply the above-described continuous fiber-reinforced silicon carbide member to parts and members requiring a mechanical property and environmental resistance.

Accordingly, a problem to be solved by the present invention is to provide a continuous fiber-reinforced silicon carbide member and a manufacturing method thereof which allow sufficient improvement in the mechanical property and the environmental resistance.

DETAILED DESCRIPTION

A continuous fiber-reinforced silicon carbide member of an embodiment is a tubular shape and has a first composite material layer and a second composite material layer. In the first composite material layer, continuous fibers of silicon carbide are combined with a matrix of silicon carbide. In the second composite material layer, continuous fibers of carbon are combined with a matrix of silicon carbide. Then, the first composite material layer and the second composite material layer are stacked.

According to the present invention, it is possible to provide a continuous fiber-reinforced silicon carbide member, a manufacturing method thereof, and a nuclear reactor structural member which allow sufficient improvement in a mechanical property and environmental resistance.

First Embodiment

[Structure]

Figure 1:
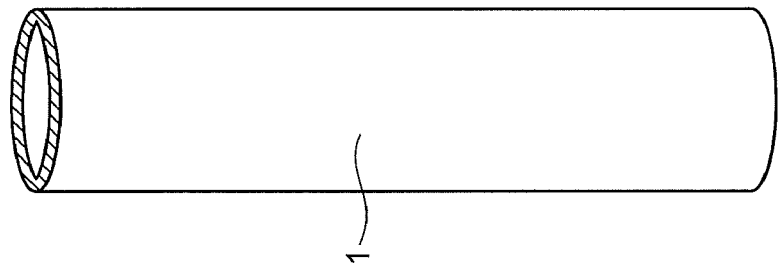
FIG. 1 is a perspective view schematically illustrating a continuous fiber-reinforced silicon carbide member according to a first embodiment.

FIG. 1 is a perspective view schematically illustrating a continuous fiber-reinforced silicon carbide member according to a first embodiment.

As illustrated in FIG. 1, a continuous fiber-reinforced silicon carbide member 1 of this embodiment is, for example, a cylindrical-shaped tubular body and has a structure in which continuous fibers are arranged continuously in the continuous fiber-reinforced silicon carbide member 1.

Figure 2:
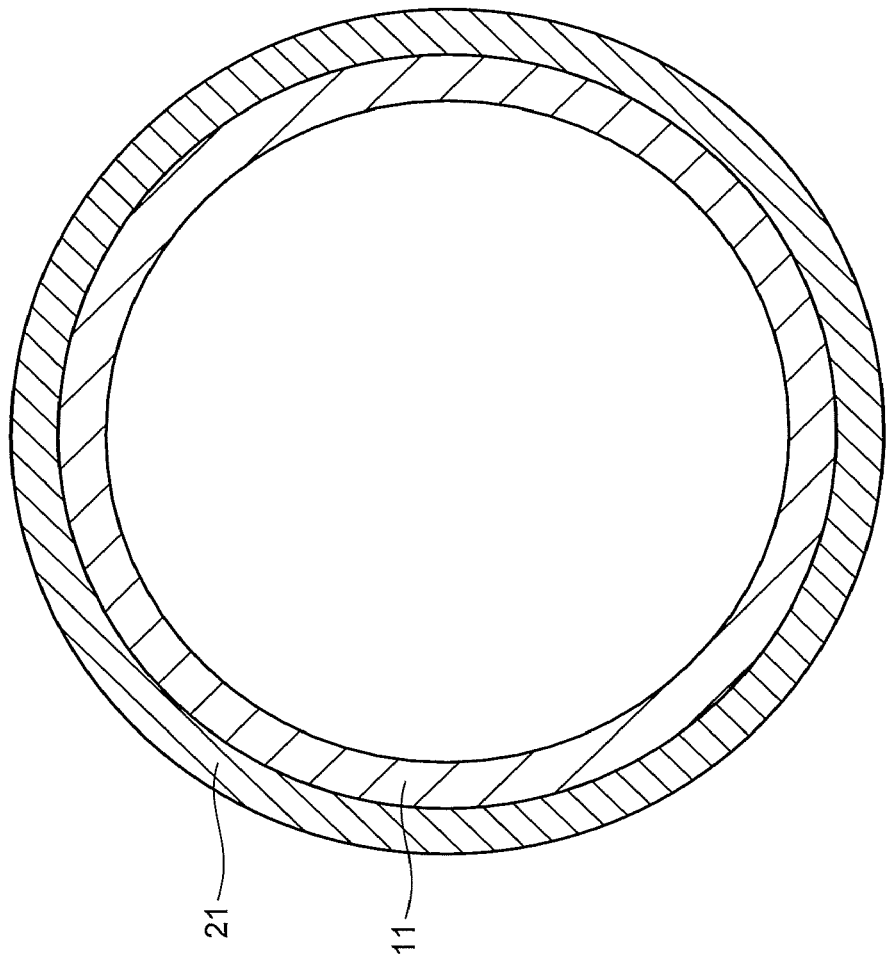
FIG. 2 is a cross-sectional view illustrating the continuous fiber-reinforced silicon carbide member according to the first embodiment.

FIG. 2 is a cross-sectional view illustrating the continuous fiber-reinforced silicon carbide member according to the first embodiment. Regarding the continuous fiber-reinforced silicon carbide member 1, FIG. 2 illustrates a cross section to which an axial direction is orthogonal.

As illustrated in FIG. 2, the continuous fiber-reinforced silicon carbide member 1 has a first composite material layer 11 and a second composite material layer 21, and the first composite material layer 11 and the second composite material layer 21 are stacked in a radial direction.

The first composite material layer 11 is a cylindrical-shaped tubular body, and continuous fibers of silicon carbide are combined with a matrix of silicon carbide.

The second composite material layer 21 is a cylindrical-shaped tubular body, and continuous fibers of carbon are combined with a matrix of silicon carbide. In this embodiment, the second composite material layer 21 is provided so as to cover an outer peripheral surface of the first composite material layer 11.

Thus, the continuous fiber-reinforced silicon carbide member 1 is constituted by the stacked structure of the first composite material layer 11 in which the continuous fibers of silicon carbide are combined with the matrix of silicon carbide and the second composite material layer 21 in which the continuous fibers of carbon are combined with the matrix of silicon carbide, thereby making it possible to achieve improvement in the environmental resistance and the mechanical property.

In the continuous fiber-reinforced silicon carbide member 1 of this embodiment, the first composite material layer 11 preferably has a thickness of not less than 0.2 mm nor more than 5 mm. Further, the second composite material layer 21 preferably has a thickness of not less than 0.2 mm nor more than 2 mm. The thickness of the first composite material layer 11 and the thickness of the second composite material layer 21 are preferably equal to or more than the lower limit values in the above-described ranges in terms of the mechanical property and the environmental resistance in the continuous fiber-reinforced silicon carbide member 1. Further, the thickness of the first composite material layer 11 and the thickness of the second composite material layer 21 are preferably equal to or less than the upper limit values in the above-described ranges in order to sufficiently exhibit a structure reinforced by the continuous fibers at a time of damage.

[Manufacturing Method]

In this embodiment, each process to be performed in manufacturing the above-described continuous fiber-reinforced silicon carbide member 1 will be sequentially explained.

In manufacturing the above-described continuous fiber-reinforced silicon carbide member 1, the first composite material layer 11 is prepared at first. In a main process, for example, a fiber bundle (yarn) is formed by bundling a plurality of continuous fibers of silicon carbide. Then, a cylindrical-shaped preform (fiber preform) is formed by using the fiber bundle. Thereafter, the first composite material layer 11 is completed by forming a matrix in the preform.

The formation of the matrix is performed by at least one method of a chemical vapor deposition method and a chemical vapor infiltration method. In this embodiment, the matrix is formed among the fibers constituting the preform by the chemical vapor infiltration method. Then, as necessary, the matrix is formed by the chemical vapor deposition method so that the matrix covers the periphery of the preform. Note that when the formation of the matrix is performed by a precursor infiltration and pyrolysis method (PIP), fine cracks occur in the matrix due to shrinkage by firing, or the like. Therefore, in order to sufficiently secure adhesiveness and airtightness in the continuous fiber-reinforced silicon carbide member 1, the formation of the matrix is preferably performed by not the precursor infiltration and pyrolysis method (PIP) but the chemical vapor deposition method or the chemical vapor infiltration method.

Next, the second composite material layer 21 is formed on the outer peripheral surface of the first composite material layer 11. In the main process, a fiber bundle (yarn) is formed by bundling a plurality of continuous fibers of carbon directly on the outer peripheral surface of the first composite material layer 11. Then, a cylindrical-shaped preform (fiber preform) is formed by using the fiber bundle. Thereafter, the second composite material layer 21 is completed by forming a matrix in the preform. The formation of the matrix of the second composite material layer 21 is performed in a manner similar to that in the case of the first composite material layer 11. Thus, the continuous fiber-reinforced silicon carbide member 1 is completed.

The continuous fiber-reinforced silicon carbide member 1 of this embodiment can be utilized suitably as materials of a nuclear reactor structural material (a structural material of a channel box, a fuel rod, or a control rod, or the like), a sealing material (a submersible pump or the like), a spacecraft member, an artificial satellite member, and so on.

Modified Example

Figure 3:
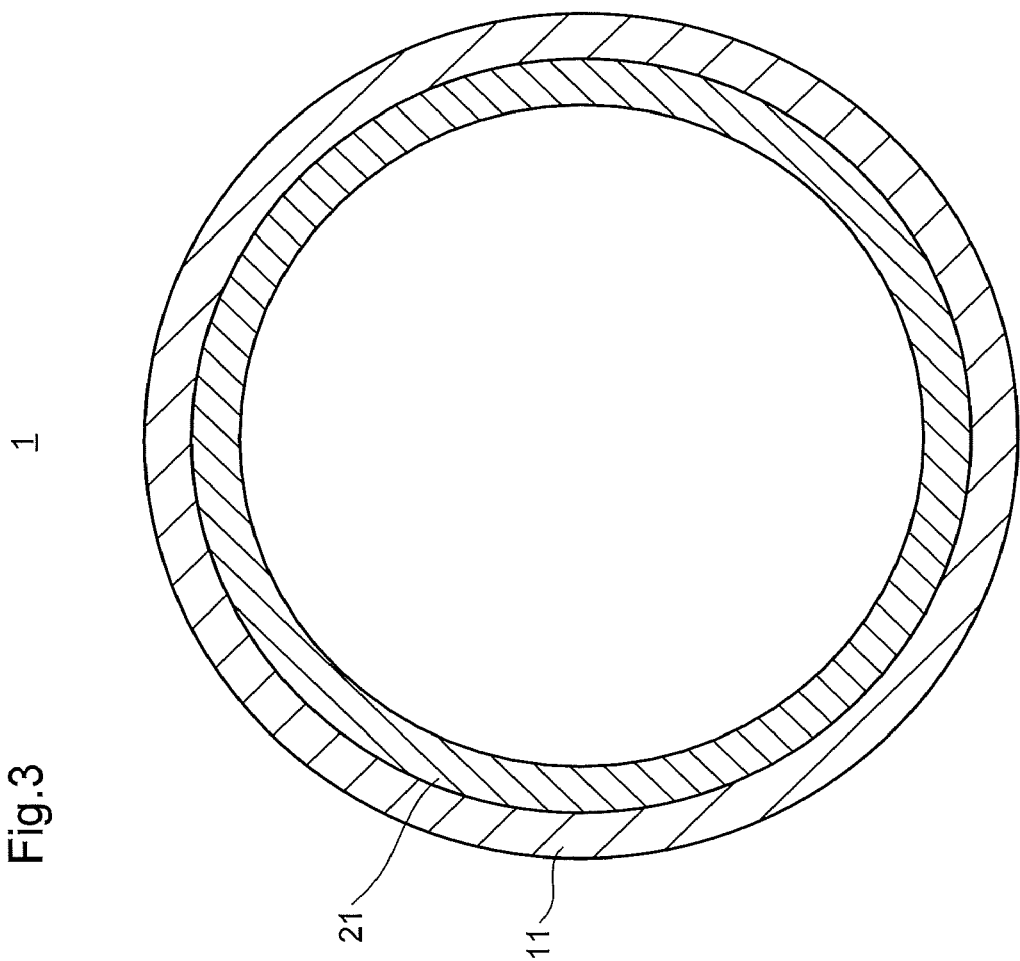
FIG. 3 is a cross-sectional view illustrating a continuous fiber-reinforced silicon carbide member according to a modified example of the first embodiment.

FIG. 3 is a cross-sectional view illustrating a continuous fiber-reinforced silicon carbide member according to a modified example of the first embodiment. Similarly to FIG. 2, regarding a continuous fiber-reinforced silicon carbide member 1, FIG. 3 illustrates a cross section to which an axial direction is orthogonal.

As illustrated in FIG. 3, in the continuous fiber-reinforced silicon carbide member 1, a first composite material layer 11 may be formed on an outer peripheral surface of a second composite material layer 21. Although illustration is omitted, in the continuous fiber-reinforced silicon carbide member 1, the second composite material layer 21 may be formed on each of an inner peripheral surface and an outer peripheral surface of the first composite material layer 11.

The continuous fiber of silicon carbide has a higher resistance than the continuous fiber of carbon under an environment in which the temperature in the atmosphere is high (for example, under an environment in which it exceeds 400° C.). Further, the continuous fiber of carbon has a higher resistance than the continuous fiber of silicon carbide under an environment in an exposure to water not higher than 400° C. Therefore, depending on these properties, the first composite material layer 11 and the second composite material layer 21 can be appropriately stacked.

Figure 4:
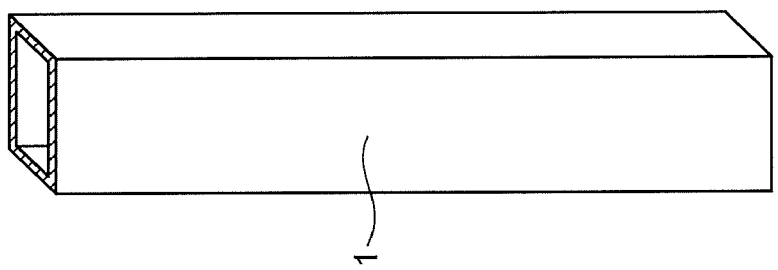
FIG. 4 is a cross-sectional view illustrating a continuous fiber-reinforced silicon carbide member according to another modified example of the first embodiment.
Figure 5:
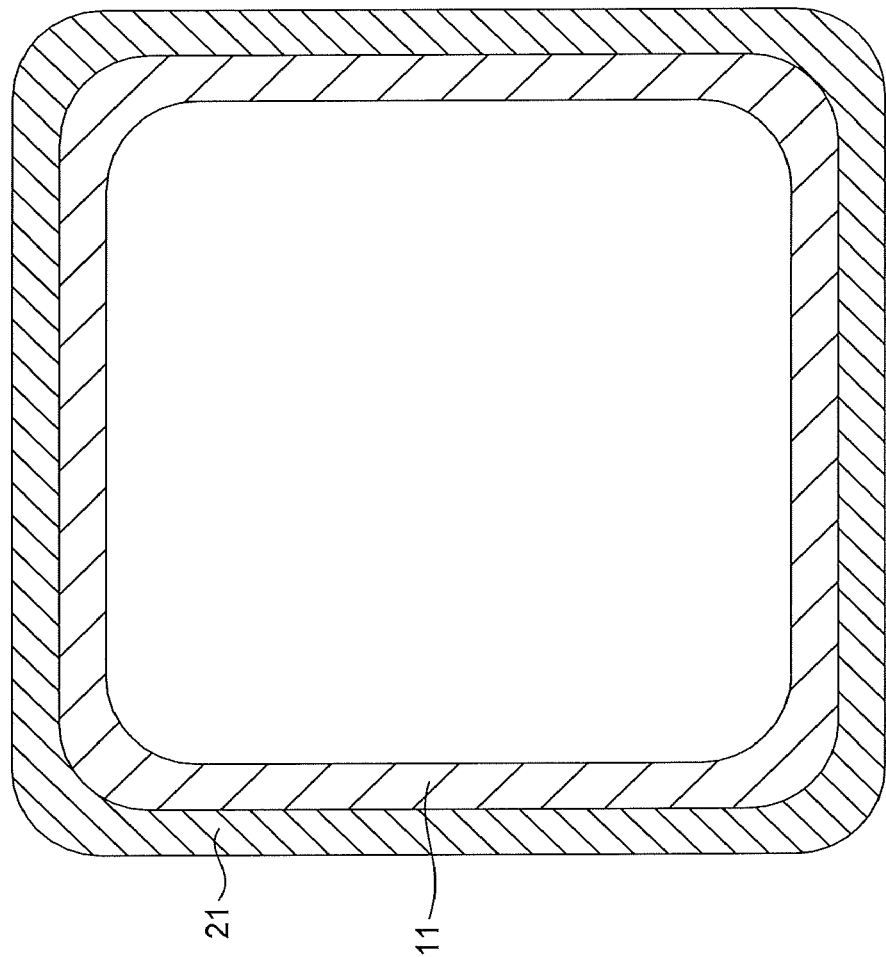
FIG. 5 is a cross-sectional view illustrating the continuous fiber-reinforced silicon carbide member according to another modified example of the first embodiment.

FIG. 4 and FIG. 5 are cross-sectional views illustrating a continuous fiber-reinforced silicon carbide member according to another modified example of the first embodiment. Similarly to FIG. 1, FIG. 4 is a perspective view of the continuous fiber-reinforced silicon carbide member, and similarly to FIG. 2, regarding a continuous fiber-reinforced silicon carbide member 1, FIG. 5 illustrates a cross section to which an axial direction is orthogonal.

As illustrated in FIG. 4, the continuous fiber-reinforced silicon carbide member 1 may be a square tube-shaped tubular body. Also in this case, as illustrated in FIG. 5, a second composite material layer 21 may be formed on an outer peripheral surface of a first composite material layer 11. Although illustration is omitted, the first composite material layer 11 may be formed on an outer peripheral surface of the second composite material layer 21. As is obvious, the second composite material layer 21 may be formed on each of an inner peripheral surface and an outer peripheral surface of the first composite material layer 11.

Second Embodiment

[Structure]

Figure 6:
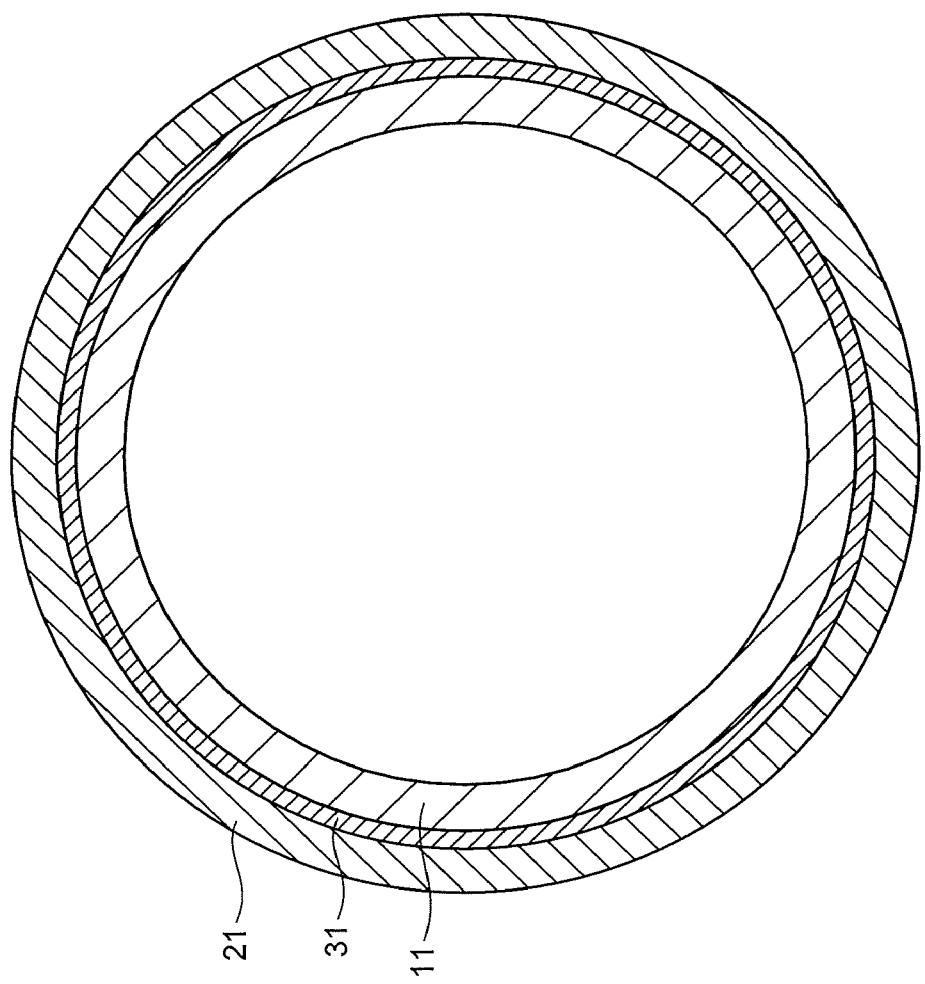
FIG. 6 is a cross-sectional view illustrating a continuous fiber-reinforced silicon carbide member according to a second embodiment.

FIG. 6 is a cross-sectional view illustrating a continuous fiber-reinforced silicon carbide member according to a second embodiment. Similarly to FIG. 2, regarding a continuous fiber-reinforced silicon carbide member 1, FIG. 6 illustrates a cross section to which an axial direction is orthogonal.

As illustrated in FIG. 6, the continuous fiber-reinforced silicon carbide member 1 of this embodiment includes a first composite material layer 11 and a second composite material layer 21 as in the case of the first embodiment.

Long fibers of silicon carbide forming the first composite material layer 11 have a tensile strength of 2 to 4 GPa and have a tensile elastic modulus of 150 to 400 GPa. Long fibers of carbon forming the second composite material layer 21 have a tensile strength of 1 to 7 GPa and have a tensile elastic modulus of 30 to 950 GPa. In the first composite material layer 11 and the second composite material layer 21, depending on a combination of the continuous fibers, there are sometimes a decrease in initial fracture strength and a decrease in fracture energy due to a difference of the tensile elastic modulus between a matrix and the continuous fibers.

However, in this embodiment, an intermediate layer 31 is interposed between the first composite material layer 11 and the second composite material layer 21. Here, the intermediate layer 31 is provided so as to cover an outer peripheral surface of the first composite material layer 11. Then, the second composite material layer 21 is provided so as to cover an outer peripheral surface of the intermediate layer 31.

In this embodiment, the intermediate layer 31 is formed of a single body of a material selected from a group constituted of carbon, boron nitride, titanium aluminum carbide, vanadium aluminum carbide, chromium aluminum carbide, niobium aluminum carbide, tantalum aluminum carbide, and titanium silicon carbide. Therefore, in this embodiment, a materials design by making use of the intermediate layer 31 formed of this specific material having different strengths between a long direction, a circumferential direction, and a thickness direction makes it possible to improve the mechanical property in a direction reinforced by the continuous fibers further than that in the case of the first embodiment.

The intermediate layer 31 preferably has a thickness of not less than 0.01 mm nor more than 0.2 mm. In order to sufficiently exhibit different mechanical properties between the first composite material layer 11 and the second composite material layer 21, the thickness of the intermediate layer 31 is preferably equal to or more than the lower limit value in the above-described range. Further, from the viewpoint of the mechanical property of the continuous fiber-reinforced silicon carbide member 1, the thickness of the intermediate layer 31 is preferably equal to or less than the upper limit value in the above-described range. Therefore, in particular, the thickness of the intermediate layer 31 more preferably falls within a range of not less than 0.02 mm nor more than 0.1 mm.

The intermediate layer 31 is a layer provided with anisotropy with a difference in strength between the long direction (axial direction) and the circumferential direction in the continuous fiber-reinforced silicon carbide member 1. The intermediate layer 31 is further preferably a monoclinic crystal which exhibits a hexagonal crystal or a pseudohexagonal crystal in crystal form. In this case, in the hexagonal crystals constituting the intermediate layer 31, a slide of a crystal plane occurs. Therefore, it is possible to suppress progress of cracks in each of the first composite material layer 11 and the second composite material layer 21. As a result, the mechanical property of the continuous fiber-reinforced silicon carbide member 1 can be improved further. In particular, regarding ternary carbide (titanium aluminum carbide, vanadium aluminum carbide, chromium aluminum carbide, niobium aluminum carbide, tantalum aluminum carbide, or titanium silicon carbide), the crystal form is further preferably the hexagonal crystal.

Note that other than the case of one single body layer of the above-described specific materials, the intermediate layer 31 may be constituted by stacking a plurality of the single body layers. For example, the intermediate layer 31 may be constituted by sequentially stacking the single body layer of carbon and the single body layer of titanium silicon carbide.

[Manufacturing Method]

In this embodiment, each process of manufacturing the above-described continuous fiber-reinforced silicon carbide member 1 will be explained.

In manufacturing the above-described continuous fiber-reinforced silicon carbide member 1, the first composite material layer 11 is prepared at first as in the case of the first embodiment.

Next, the intermediate layer 31 is formed on the outer peripheral surface of the prepared first composite material layer 11. The formation of the intermediate layer 31 is performed by a deposition method such as a vacuum deposition method, an ion plating method, a sputtering method, a plasma CVD method, a thermal CVD method, a photo-CVD method, or a MOCVD method. Among these, the thermal CVD method is suitable because the deposition of the first composite material layer 11 and the deposition of the intermediate layer 31 can be performed continuously by changing source gases.

Next, the second composite material layer 21 is formed on the outer peripheral surface of the intermediate layer 31. The formation of the second composite material layer 21 is performed in a manner similar to that in the case of the first embodiment. Thus, the continuous fiber-reinforced silicon carbide member 1 of this embodiment is completed.

Modified Example

Figure 7:
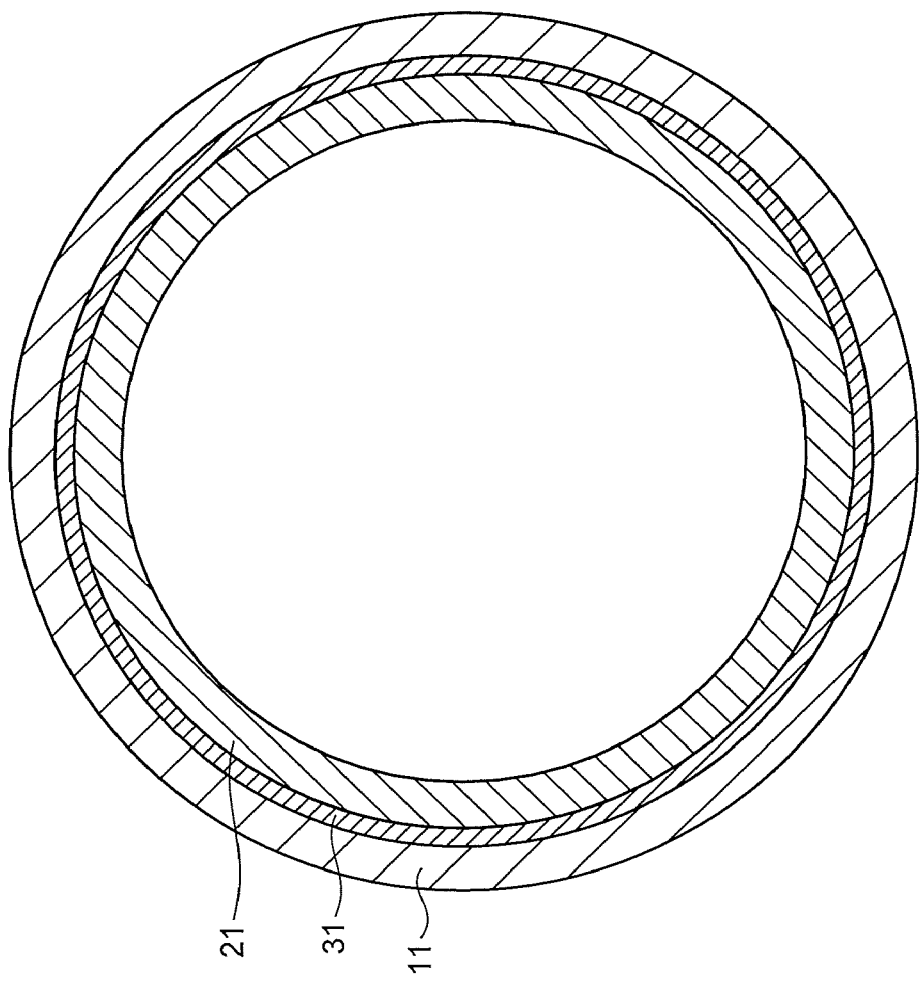
FIG. 7 is a cross-sectional view illustrating a continuous fiber-reinforced silicon carbide member according to a modified example of the second embodiment.
Figure 8:
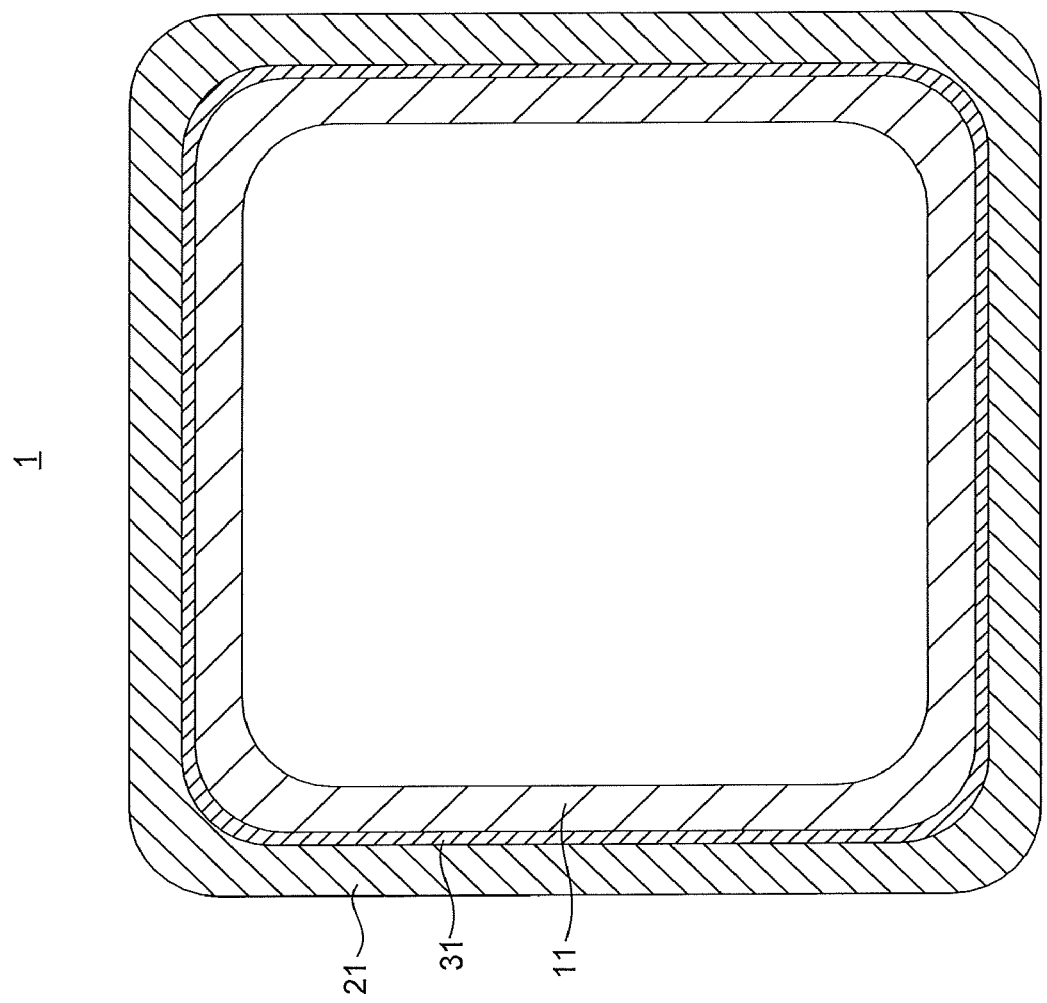
FIG. 8 is a cross-sectional view illustrating a continuous fiber-reinforced silicon carbide member according to a modified example of the second embodiment.

FIG. 7 and FIG. 8 are cross-sectional views illustrating continuous fiber-reinforced silicon carbide members according to modified examples of the second embodiment. Similarly to FIG. 6, regarding continuous fiber-reinforced silicon carbide members 1, FIG. 7 and FIG. 8 each illustrate a cross section to which an axial direction is orthogonal.

As illustrated in FIG. 7, in the continuous fiber-reinforced silicon carbide member 1, an intermediate layer 31 and a first composite material layer 11 may be sequentially formed on an outer peripheral surface of a second composite material layer 21.

Further, as illustrated in FIG. 8, the continuous fiber-reinforced silicon carbide member 1 may be a square tube-shaped tubular body. Also in this case, the intermediate layer 31 and the second composite material layer 21 may be sequentially formed on an outer peripheral surface of the first composite material layer 11. Although illustration is omitted, the intermediate layer 31 and the first composite material layer 11 may be sequentially formed on an outer peripheral surface of the second composite material layer 21.

Third Embodiment

[Structure]

Figure 9:
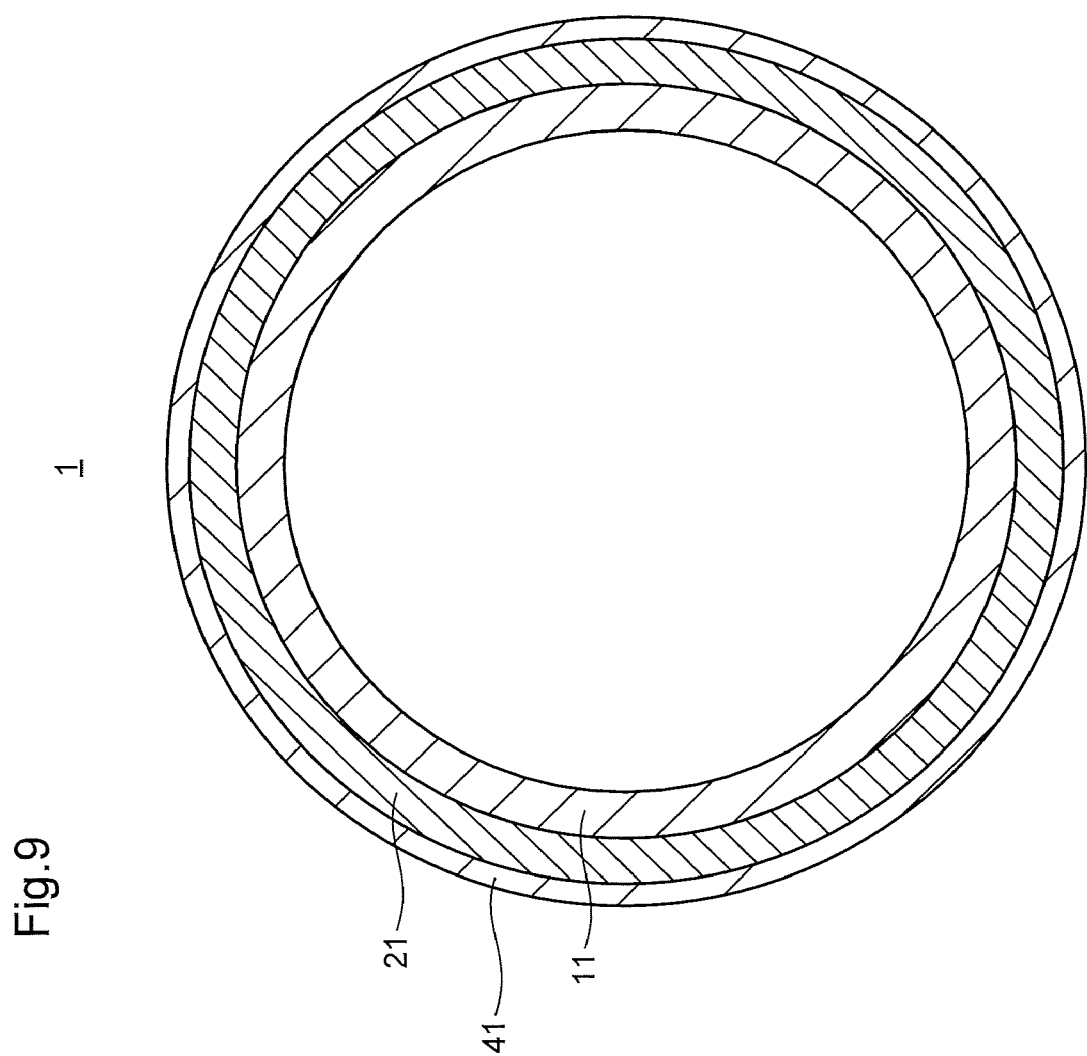
FIG. 9 is a cross-sectional view illustrating a continuous fiber-reinforced silicon carbide member according to a third embodiment.

FIG. 9 is a cross-sectional view illustrating a continuous fiber-reinforced silicon carbide member according to a third embodiment. Similarly to FIG. 2, regarding a continuous fiber-reinforced silicon carbide member 1, FIG. 9 illustrates a cross section to which an axial direction is orthogonal.

As illustrated in FIG. 9, in this embodiment, differently from the case of the first embodiment, the continuous fiber-reinforced silicon carbide member 1 has a coating material layer 41 further. Because this embodiment is as in the case of the first embodiment except this point and a point related to this, mention is appropriately omitted regarding redundant portions.

The coating material layer 41 is provided so as to cover an outer peripheral surface of a second composite material layer 21.

In this embodiment, the coating material layer 41 is formed of a single body of a material selected from a group constituted of carbon, titanium carbide, chromium nitride, chromium aluminum nitride, yttrium silicate, ytterbium silicate, scandium silicate, and a zirconium alloy. Thus, since a surface of the continuous fiber-reinforced silicon carbide member 1 is in a state of being covered with the coating material layer 41 formed of the above-described specific material, a corrosion thickness-reduction amount becomes smaller than those in the cases of the above-described other embodiments, and it is possible to further easily achieve improvement in the environmental resistance.

On a surface to be exposed to water in the continuous fiber-reinforced silicon carbide member 1, the coating material layer 41 is preferably formed of carbon, titanium carbide, or chromium nitride among the above-described materials. Further, because chromium aluminum nitride, yttrium silicate, ytterbium silicate, and scandium silicate each have a thermal expansion coefficient close to that of silicon carbide (SiC) constituting a matrix in each of a first composite material layer 11 and the second composite material layer 21, they are suitably used.

The coating material layer 41 preferably has a thickness of not less than 0.05 mm nor more than 0.5 mm. When the coating material layer 41 is thinner than the lower limit value in the above-described range, the environmental resistance sometimes cannot be maintained sufficiently and the mechanical property sometimes becomes insufficient in the continuous fiber-reinforced silicon carbide member 1. Further, when the coating material layer 41 is thicker than the upper limit value in the above-described range, the mechanical property of the continuous fiber-reinforced silicon carbide member 1 sometimes becomes insufficient due to the coating material layer 41. That is, shear strength of the coating material layer 41 itself sometimes affects adhesiveness between the continuous fiber-reinforced silicon carbide member 1 and the coating material layer 41.

Note that other than the case of one single body layer of the above-described specific materials, the coating material layer 41 may be constituted by stacking a plurality of the single body layers. For example, the coating material layer 41 may be constituted by sequentially stacking the single body layer of chromium nitride and the single body layer of yttrium silicate.

The coating material layer is preferably formed of a material selected from a group constituted of carbon, titanium carbide, chromium nitride, chromium aluminum nitride, yttrium silicate, ytterbium silicate, scandium silicate, and a zirconium alloy at a low temperature below 400° C. in an environmental temperature, a material selected from a group constituted of titanium carbide, chromium nitride, chromium aluminum nitride, yttrium silicate, ytterbium silicate, scandium silicate, and a zirconium alloy at a moderate temperature below 900° C. therein, or a material selected from a group constituted of yttrium silicate, ytterbium silicate, and scandium silicate at a high temperature below 1500° C. therein.

[Manufacturing Method]

In this embodiment, each process of manufacturing the above-described continuous fiber-reinforced silicon carbide member 1 will be explained.

In manufacturing the above-described continuous fiber-reinforced silicon carbide member 1, the first composite material layer 11 and the second composite material layer 21 are formed at first as in the case of the first embodiment.

Next, the coating material layer 41 is formed on the outer peripheral surface of the second composite material layer 21. The formation of the coating material layer 41 is performed by a plasma CVD method, a thermal CVD method, a photo-CVD method, a MOCVD method, a plasma spraying method, a suspension plasma spraying method, or an aerosol deposition method.

Modified Example

Figure 10:
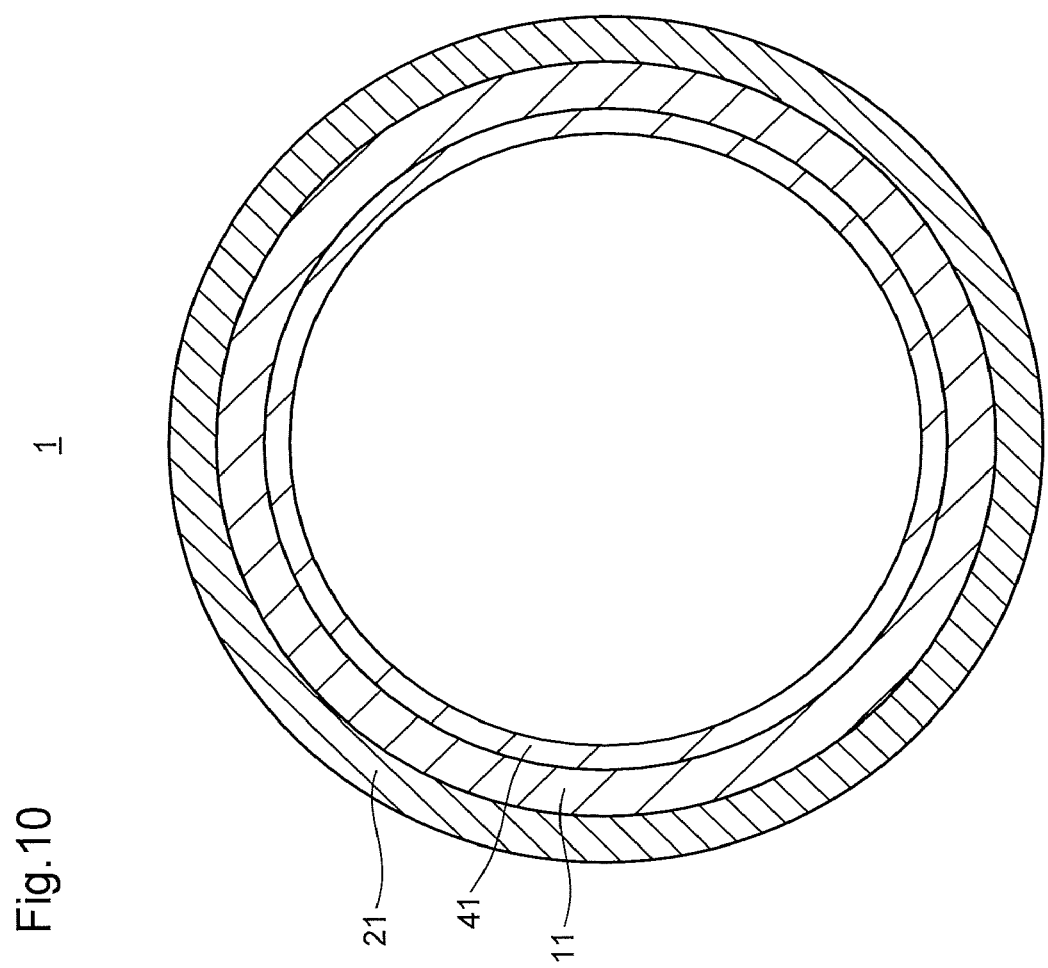
FIG. 10 is a cross-sectional view illustrating a continuous fiber-reinforced silicon carbide member according to a modified example of the third embodiment.
Figure 11:
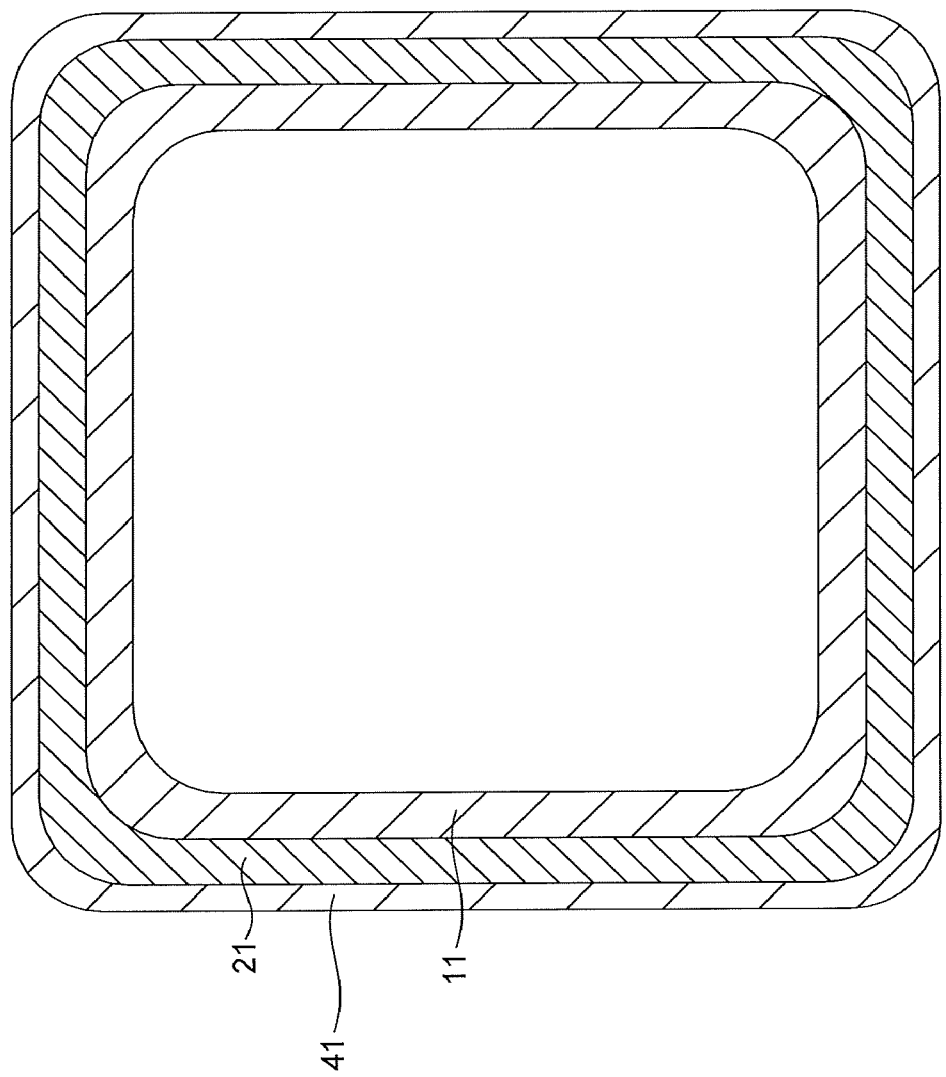
FIG. 11 is a cross-sectional view illustrating a continuous fiber-reinforced silicon carbide member according to a modified example of the third embodiment.

FIG. 10 and FIG. 11 are cross-sectional views illustrating continuous fiber-reinforced silicon carbide members according to modified examples of the third embodiment. Similarly to FIG. 9, regarding continuous fiber-reinforced silicon carbide members 1, FIG. 10 and FIG. 11 each illustrate a cross section to which an axial direction is orthogonal.

As illustrated in FIG. 10, in the continuous fiber-reinforced silicon carbide member 1, a coating material layer 41 may be formed on an inner peripheral surface of a first composite material layer 11. Although illustration is omitted, in the continuous fiber-reinforced silicon carbide member 1, the coating material layer 41 may be formed on each of an inner peripheral surface of the first composite material layer 11 and an outer peripheral surface of a second composite material layer 21. That is, the coating material layer 41 may be formed on at least one of an inner peripheral surface and an outer peripheral surface in the continuous fiber-reinforced silicon carbide member 1.

Further, as illustrated in FIG. 11, the continuous fiber-reinforced silicon carbide member 1 may be a square tube-shaped tubular body. Also in this case, the second composite material layer 21 and the coating material layer 41 may be sequentially formed on an outer peripheral surface of the first composite material layer 11. Although illustration is omitted, the first composite material layer 11 and the coating material layer 41 may be sequentially formed on an outer peripheral surface of the second composite material layer 21.

Fourth Embodiment

[Structure and so On]

Figure 12:
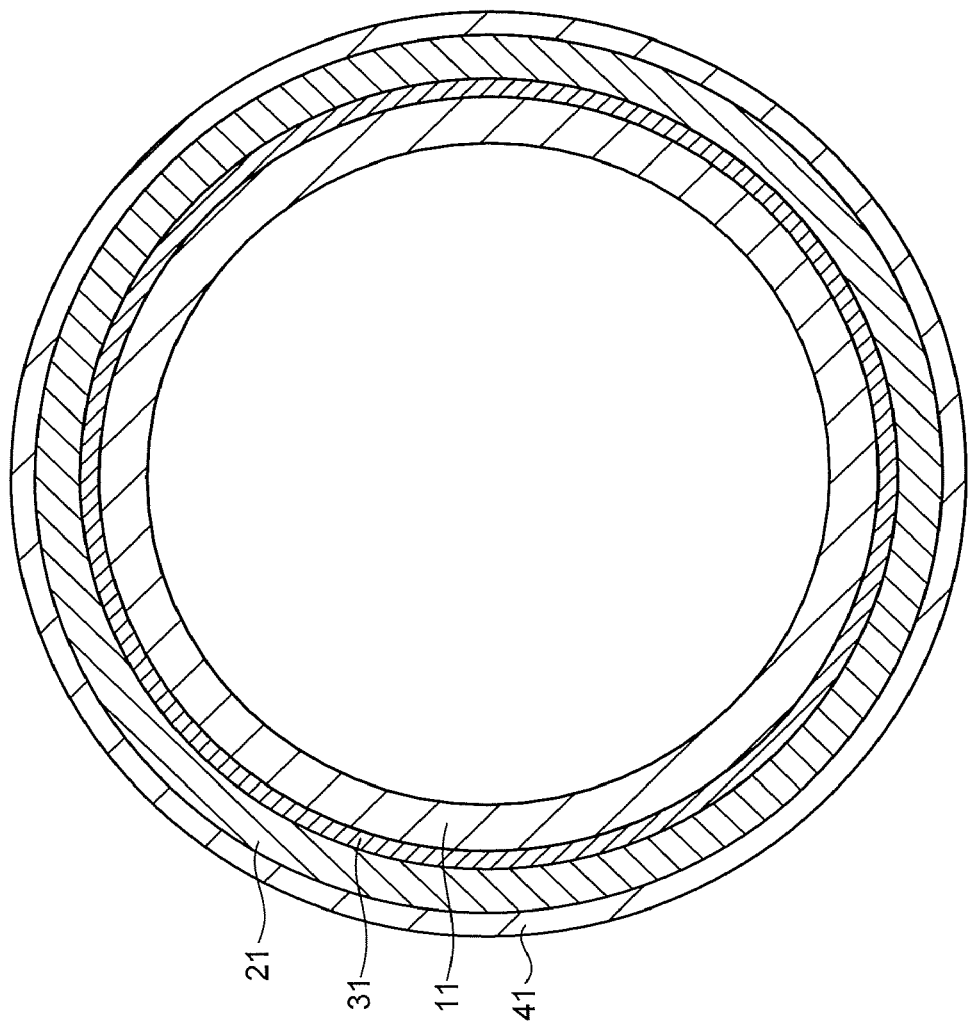
FIG. 12 is a cross-sectional view illustrating a continuous fiber-reinforced silicon carbide member according to a fourth embodiment.

FIG. 12 is a cross-sectional view illustrating a continuous fiber-reinforced silicon carbide member according to a fourth embodiment. Similarly to FIG. 6, regarding a continuous fiber-reinforced silicon carbide member 1, FIG. 12 illustrates a cross section to which an axial direction is orthogonal.

As illustrated in FIG. 12, in this embodiment, the continuous fiber-reinforced silicon carbide member 1 is as in the case of the second embodiment except for having a coating material layer 41 further. The coating material layer 41 is similar to the coating material layer 41 indicated in the third embodiment.

Therefore, although a detailed explanation is omitted, in this embodiment, as in the case of the second embodiment, the action of an intermediate layer 31 allows further improvement in the mechanical property. Further, in this embodiment, as in the case of the third embodiment, the action of the coating material layer 41 allows further improvement in the environmental resistance.

Modified Example

Figure 13:
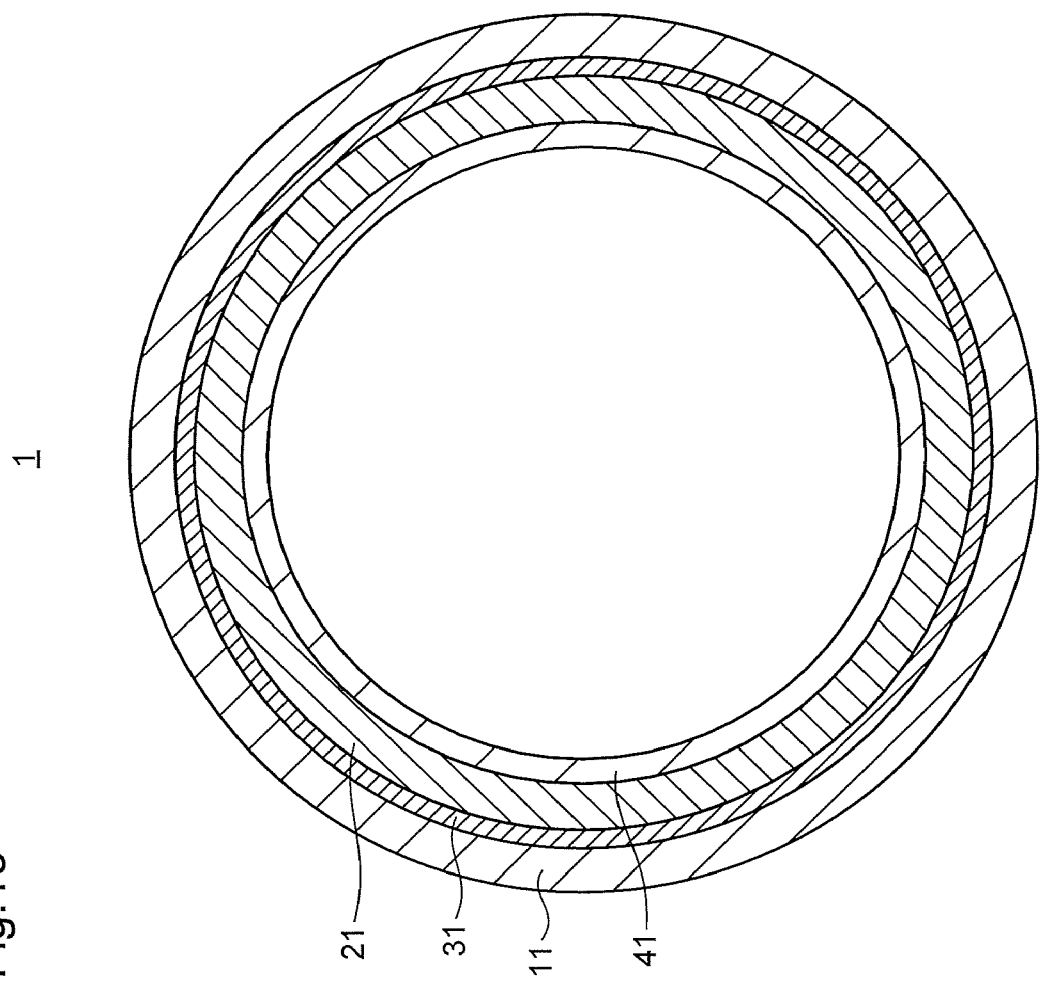
FIG. 13 is a cross-sectional view illustrating a continuous fiber-reinforced silicon carbide member according to a modified example of the fourth embodiment.
Figure 14:
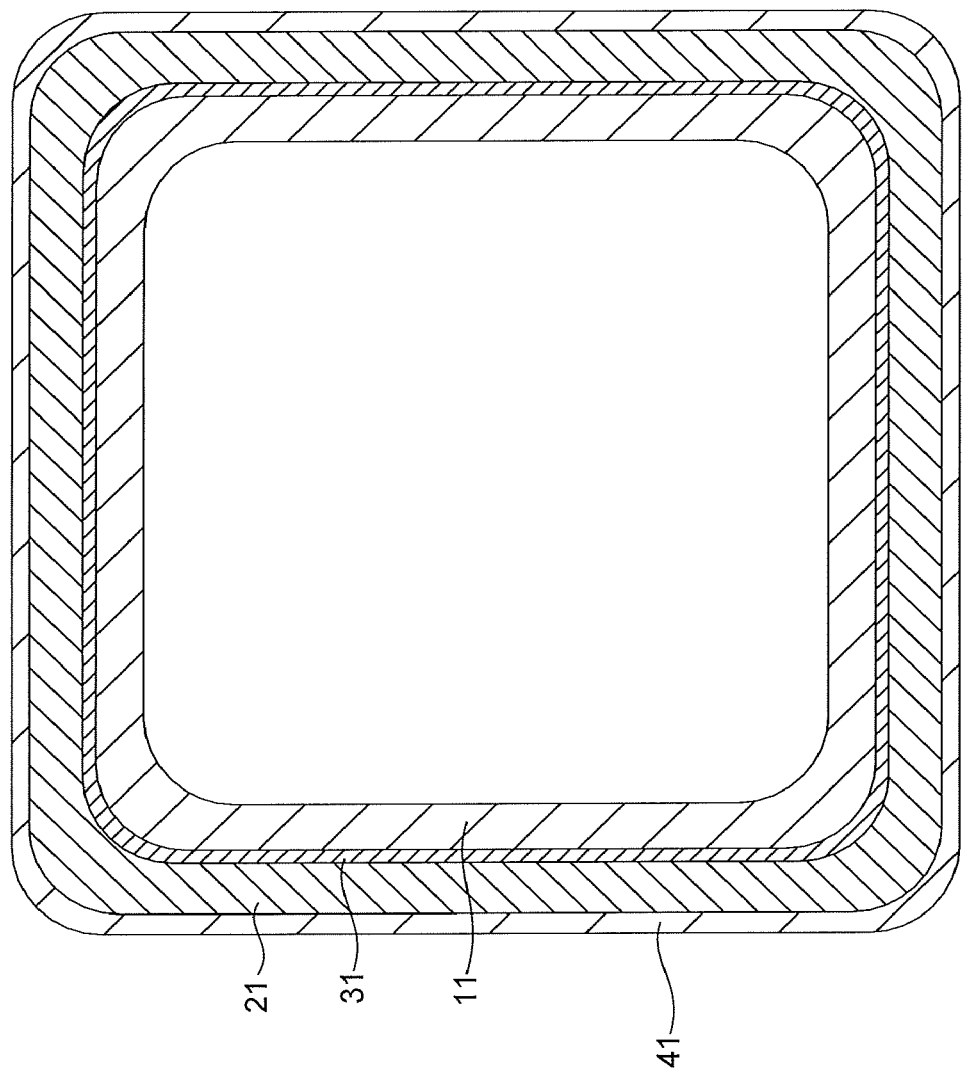
FIG. 14 is a cross-sectional view illustrating a continuous fiber-reinforced silicon carbide member according to a modified example of the fourth embodiment.

FIG. 13 and FIG. 14 are cross-sectional views illustrating continuous fiber-reinforced silicon carbide members according to modified examples of the fourth embodiment. Similarly to FIG. 12, regarding continuous fiber-reinforced silicon carbide members 1, FIG. 13 and FIG. 14 each illustrate a cross section to which an axial direction is orthogonal.

As illustrated in FIG. 13, in the continuous fiber-reinforced silicon carbide member 1, a coating material layer 41 may be formed along an inner peripheral surface of a first composite material layer 11. Although illustration is omitted, in the continuous fiber-reinforced silicon carbide member 1, the coating material layer 41 may be formed on each of an inner peripheral surface of the first composite material layer 11 and an outer peripheral surface of a second composite material layer 21.

Further, as illustrated in FIG. 14, the continuous fiber-reinforced silicon carbide member 1 may be a square tube-shaped tubular body. Also in this case, the second composite material layer 21 and the coating material layer 41 may be sequentially formed along an outer peripheral surface of the first composite material layer 11. Although illustration is omitted, the first composite material layer 11 and the coating material layer 41 may be sequentially formed on an outer peripheral surface of the second composite material layer 21.

EXAMPLES

Hereinafter, Examples and Comparative example of the above-described continuous fiber-reinforced silicon carbide members 1 will be explained by using Table 1. Note that in the explanations regarding Examples, for easy understanding, the respective portions are denoted by the reference signs similarly to the above-described embodiments. Note that in each of Examples, a thickness of each layer was measured by using an X-ray CT scanner TDM2300H-FP (Yamato Scientific Co., Ltd.).

TABLE 1

| | First Composite Material Layer | | | Intermediate Layer | | Second Composite Material Layer | | | Coating Material Layer | | Evaluation Result | | |
|---|---|---|---|---|---|---|---|---|---|---|---|---|---|
| | | | | | | | | | | | Environmental Resistance Test | Corrosion Thickness-Reduction Amount Initial | |
| | Material | | Thickness | | Thickness | Material | | Thickness | | Thickness | Mechanical Property Test | Fracture Strength | Fracture Energy |
| | Fiber | Matrix | (mm) | Material | (mm) | Fiber | Matrix | (mm) | Material | (mm) | | | |
| Example 1 | SiC | SiC | 1.0 | — | — | C | SiC | 0.5 | — | — | 0.2 | 2 | 1.2 |
| Example 2 | SiC | SiC | 1.0 | C | 0.02 | C | SiC | 0.5 | — | — | 0.2 | 1.5 | 1.8 |
| Example 3 | SiC | SiC | 1.0 | $Cr_2AlC$ | 0.02 | C | SiC | 0.5 | — | — | 0.2 | 1.5 | 1.8 |
| Example 4 | SiC | SiC | 1.0 | — | — | C | SiC | 0.5 | CrN | 0.05 | 0 | 2 | 1.5 |
| Example 5 | SiC | SiC | 1.0 | $Ti_3SiC_2$ | 0.02 | C | SiC | 0.5 | $Yb_2Si_2O_7$ | 0.1 | 0 | 1.5 | 2 |
| Comparative-example 1 | SiC | SiC | 1.5 | — | — | — | — | — | — | — | 1 | 1 | 1 |

Example 1

In Example 1, in producing a continuous fiber-reinforced silicon carbide member 1, the formation of a preform forming a first composite material layer 11 was performed at first. In a main process, first, on a surface of continuous fibers of silicon carbide (brand name: Hi-Nicalon (registered trademark) Type S, manufactured by Nippon Carbon Co., Ltd.), each of which has a diameter of 12 μm, carbon was covered by a CVD method. Then, by using a fiber bundle (yarn) obtained by bundling the 500 continuous fibers, a cylindrical-shaped preform (whose thickness is 1.0 mm) was produced by a filament winding method.

Next, a matrix was formed in the preform of the first composite material layer 11. In the main process, after setting the above-described preform inside a carbon mold in a chemical vapor reactor, under conditions of temperatures of 1300 to 1400° C. and pressures of 4 to 100 kPa, source gases (silicon tetrachloride gas, propane gas, and hydrogen gas) were introduced to the inside of the reactor. Thus, a matrix whose main component was silicon carbide was formed in the preform to prepare the first composite material layer 11 with a thickness of 1 mm. Here, the matrix was formed among the fibers constituting the preform of the first composite material layer 11 by a chemical vapor infiltration method, and the matrix was formed by a chemical vapor deposition method so that the matrix covers the periphery of the preform.

Next, the formation of a preform forming a second composite material layer 21 was performed. In the main process, first, on a surface of continuous fibers of carbon (brand name: Torayca (registered trademark) M60, manufactured Toray Industries, Inc.), each of which has a diameter of 10 μm, carbon was covered by the CVD method. Then, by using a fiber bundle (yarn) obtained by bundling the 300 continuous fibers, a cylindrical-shaped preform (whose thickness is 0.5 mm) was produced on an outer peripheral surface of the first composite material layer 11 by the filament winding method.

Next, a matrix was formed in the preform of the second composite material layer 21. In the main process, after setting the above-described preform inside a carbon mold in a chemical vapor reactor, under conditions of temperatures of 1300 to 1400° C. and pressures of 4 to 100 kPa, source gases (silicon tetrachloride gas, propane gas, and hydrogen gas) were introduced to the inside of the reactor. Thus, a matrix whose main component was silicon carbide was formed in the preform, thereby forming the second composite material layer 21 with a thickness of 1 mm. Here, as in the case of the first composite material layer 11, the matrix was formed among the fibers constituting the preform of the second composite material layer 21 by the chemical vapor infiltration method, and the matrix was formed by the chemical vapor deposition method so that the matrix covers the periphery of the preform. Thus, the continuous fiber-reinforced silicon carbide member 1 in Example 1 was completed.

Example 2

In Example 2, as in the case of Example 1, after preparing a first composite material layer 11, an intermediate layer 31 was formed on an outer peripheral surface of the first composite material layer 11. Here, by depositing a single body layer (whose thickness is 0.02 mm) of carbon (C), the formation of the intermediate layer 31 was performed. Thereafter, as in the case of Example 1, a second composite material layer 21 was formed along an outer peripheral surface of the first composite material layer 11 with the intermediate layer 31 interposed therebetween. Thus, a continuous fiber-reinforced silicon carbide member 1 in Example 2 was completed.

Example 3

In Example 3, except for forming a single body layer (whose thickness is 0.02 mm) of chromium aluminum carbide ($Cr_2AlC$) as an intermediate layer 31, as in the case of Example 2, a continuous fiber-reinforced silicon carbide member 1 was produced.

Example 4

In Example 4, as in the case of Example 1, after preparing a first composite material layer 11, a second composite material layer 21 was formed on an outer peripheral surface of the first composite material layer 11. Thereafter, a coating material layer 41 was formed on an outer peripheral surface of the second composite material layer 21. Here, by depositing a single body layer (whose thickness is 0.05 mm) of chromium nitride (CrN), the formation of the coating material layer 41 was performed. Thus, a continuous fiber-reinforced silicon carbide member 1 in Example 4 was completed.

Example 5

In Example 5, as in the case of Example 1, after preparing a first composite material layer 11, an intermediate layer 31 was formed on an outer peripheral surface of the first composite material layer 11. Here, by depositing a single body layer (whose thickness is 0.02 mm) of titanium silicon carbide ($Ti_3SiC_2$), the formation of the intermediate layer 31 was performed. Then, as in the case of Example 1, a second composite material layer 21 was formed along an outer peripheral surface of the first composite material layer 11 with the intermediate layer 31 interposed therebetween. Thereafter, a coating material layer 41 was formed on an outer peripheral surface of the second composite material layer 21. Here, by depositing a single body layer (whose thickness is 0.1 mm) of yttrium silicate ($Y_2SiO_5$), the formation of the coating material layer 41 was performed. Thus, a continuous fiber-reinforced silicon carbide member 1 in Example 5 was completed.

Comparative Example

In Comparative example, as in the case of Example 1, the formation of a first composite material layer 11 was performed, but the formation of a second composite material layer 21 was not performed. Thus, a continuous fiber-reinforced silicon carbide member 1 constituted of only the first composite material layer 11 was prepared as Comparative example.

[Test Contents]

As presented in Table 1, regarding the samples in Examples and Comparative example, an environmental resistance test and a mechanical property test were performed.

Here, as the environmental resistance test, a superheated steam test was performed. The superheated steam test was performed under the following test conditions by using an autoclave. Then, the weight before the test and the weight after the test were measured, and a thickness-reduction amount was converted from a difference value between both weights. Table 1 presents ratios obtained by dividing values found in Examples by a value in Comparative example. That is, the ratios of the values in Examples in a case of setting the value in Comparative example as "1" are presented.
(Conditions of Superheated Steam Test)
Temperature: 360° C.
Steam pressure: 0.2 MPa
Holding time: one week Regarding the samples in the examples which underwent the above-described environmental resistance test, the mechanical property test was performed. Here, as the mechanical property test, by performing a tensile strength test at room temperature, each of initial fracture strength and fracture energy was measured. A test method was conducted in conformity to ASTM C1793-15. Also regarding each of the initial fracture strength and the fracture energy, Table 1 presents ratios obtained by dividing values found in Examples by a value in Comparative example. That is, the ratios of the values in Examples in a case of setting the value in Comparative example as "1" are presented.

Evaluation Result

As presented in Table 1, the continuous fiber-reinforced silicon carbide member 1 in Example 1 is excellent in environmental resistance since its corrosion thickness-reduction amount is smaller than that in Comparative example in the environmental resistance test. Further, the continuous fiber-reinforced silicon carbide member 1 in Example 1 is excellent in a mechanical property since its initial fracture strength and fracture energy are higher than those in Comparative example in the mechanical property test. The continuous fiber-reinforced silicon carbide member 1 in Example 1 is constituted by a stacked structure of the first composite material layer 11 in which the continuous fibers of silicon carbide are combined with the matrix of silicon carbide and the second composite material layer 21 in which the continuous fibers of carbon are combined with the matrix of silicon carbide. In contrast, the continuous fiber-reinforced silicon carbide member 1 in Comparative example is constituted of only the first composite material layer 11. Thus, stacking the second composite material layer 21 in which the continuous fibers of carbon are combined with the matrix of silicon carbide with respect to the first composite material layer 11 in which the continuous fibers of silicon carbide are combined with the matrix of silicon carbide makes it possible to achieve improvement in the environmental resistance and the mechanical property.

The continuous fiber-reinforced silicon carbide members 1 in Example 2 and Example 3 are excellent in the environmental resistance similarly to Example 1 since their corrosion thickness-reduction amounts are smaller than that in Comparative example in the environmental resistance test. Further, the continuous fiber-reinforced silicon carbide members 1 in Example 2 and Example 3 are excellent in the mechanical property similarly to Example 1 since their initial fracture strength and fracture energy are higher than those in Comparative example in the mechanical property test. In particular, the fracture energy in Example 2 and Example 3 is higher than that in Example 1. In Example 2, the single body layer of carbon (C) is provided as the intermediate layer 31 between the first composite material layer 11 and the second composite material layer 21. In Example 3, the single body layer of chromium aluminum carbide ($Cr_2AlC$) is provided as the intermediate layer 31. Thus, interposing the intermediate layer 31 formed of the specific material between the first composite material layer 11 and the second composite material layer 21 makes the fracture energy high, and therefore it is possible to improve the mechanical property further.

Although no citation is made as Example in Table 1, other than the case where the intermediate layer 31 is the single body layer of carbon or chromium aluminum carbide, also in the case where it is the single body layer of boron nitride, titanium aluminum carbide, vanadium aluminum carbide, niobium aluminum carbide, tantalum aluminum carbide, or titanium silicon carbide, it is similarly possible to achieve the improvement in the environmental resistance and the mechanical property.

The continuous fiber-reinforced silicon carbide members 1 in Example 4 and Example 5 are excellent in the environmental resistance similarly to the above-described Examples since their corrosion thickness-reduction amounts are smaller than that in Comparative example in the environmental resistance test. Further, the continuous fiber-reinforced silicon carbide members 1 in Example 4 and Example 5 are excellent in the mechanical property similarly to the above-described Examples since their initial fracture strength and fracture energy are higher than those in Comparative example in the mechanical property test. In particular, the corrosion thickness-reduction amounts in Example 4 and Example 5 are smaller than those in the cases of Example 1 to Example 3. In Example 4, the single body layer of chromium nitride (CrN) is formed on a surface as the coating material layer 41. In Example 5, the single body layer of ytterbium silicate ($Yb_2Si_2O_7$) is formed on a surface as the coating material layer 41. Thus, covering the surface with the coating material layer 41 formed of the specific material makes the corrosion thickness-reduction amount small, and therefore it is possible to easily achieve the improvement in the environmental resistance in particular.

Although no citation is made as Example in Table 1, other than the case where the coating material layer 41 is the single body layer of chromium nitride or ytterbium silicate, also in the case where it is the single body layer of carbon, titanium carbide, chromium aluminum nitride, yttrium silicate, ytterbium silicate, scandium silicate, or a zirconium alloy, it is similarly possible to achieve the improvement in the environmental resistance and the mechanical property.

Others

Although a thickness of each of the layers was measured by using an X-ray CT scanner in the above-described Examples, measurement by ultrasonic measurement or by using a thickness gauge, a displacement meter, or the like is allowable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

REFERENCE SIGN LIST

1 . . . continuous fiber-reinforced silicon carbide member, 11 . . . first composite material layer, 21 . . . second composite material layer, 31 . . . intermediate layer, 41 . . . coating material layer

What is claimed is:

1. A continuous fiber-reinforced silicon carbide member which is a tube-shaped continuous fiber-reinforced silicon carbide member, the member comprising:
   a first composite material layer in which fiber bundles including bundled long fibers which are continuous fibers of silicon carbide are combined with a matrix of silicon carbide;
   a second composite material layer in which fiber bundles including bundled long fibers which are continuous fibers consisting of carbon are combined with a matrix of silicon carbide, wherein the second composite material layer does not include other fibers other than the continuous fibers of carbon; and
   an intermediate layer interposed between, and directly contacting, the first composite material layer and the second composite material layer,
   wherein the first composite material layer and the second composite material layer are stacked by the first composite material layer being formed on an outer peripheral surface of the second composite material layer,
   wherein the intermediate layer is formed of a single body of a material selected from the group consisting of titanium aluminum carbide, vanadium aluminum carbide, chromium aluminum carbide, niobium aluminum carbide, tantalum aluminum carbide, and titanium silicon carbide,
   wherein the fiber bundles of the first composite material layer comprise 500 to 3000 pieces of the continuous fibers of silicon carbide, each having a diameter of 12 µm, and
   wherein the long fibers of the fiber bundles of the second composite material layer each have a diameter of 10 µm.

2. The member of claim 1, wherein the first composite material layer has a thickness of not less than 0.2 mm nor more than 5 mm.

3. The member of claim 1, wherein the second composite material layer has a thickness of not less than 0.2 mm nor more than 2 mm.

4. The member of claim 1, wherein the intermediate layer has hexagonal crystal in crystal form.

5. The member of claim 1, wherein the intermediate layer has a thickness of not less than 0.01 mm nor more than 0.2 mm.

6. The member of claim 1, wherein the intermediate layer is a monoclinic crystal which exhibits a hexagonal or pseudohexagonal crystalline form.

7. The member of claim 1, wherein the intermediate layer is the titanium aluminum carbide.

8. The member of claim 1, wherein the intermediate layer is the vanadium aluminum carbide.

9. The member of claim 1, wherein the intermediate layer is the chromium aluminum carbide.

10. The member of claim 1, wherein the intermediate layer is the niobium aluminum carbide.

11. The member of claim 1, wherein the intermediate layer is the tantalum aluminum carbide.

12. The member of claim 1, wherein the intermediate layer is the titanium silicon carbide.

13. The member of claim 1, wherein the intermediate layer consists of titanium aluminum carbide.

14. The continuous fiber-reinforced silicon carbide member of claim 1, wherein the fiber bundles of the second composite material layer comprise 300 pieces of the continuous fibers of carbon.

15. A continuous fiber-reinforced silicon carbide member which is a tube-shaped continuous fiber-reinforced silicon carbide member, the member comprising:
   a first composite material layer in which fiber bundles including bundled long fibers which are continuous fibers of silicon carbide are combined with a matrix of silicon carbide;
   a second composite material layer in which fiber bundles including bundled long fibers which are continuous fibers consisting of carbon are combined with a matrix of silicon carbide, wherein the second composite material layer does not include other fibers other than the continuous fibers of carbon; and
   an intermediate layer interposed between, and directly contacting, the first composite material layer and the second composite material layer,
   wherein the first composite material layer and the second composite material layer are stacked by the second composite material layer being formed on an outer peripheral surface of the first composite material layer,
   wherein the intermediate layer is formed of a single body of a material selected from the group consisting of titanium aluminum carbide, vanadium aluminum carbide, chromium aluminum carbide, niobium aluminum carbide, tantalum aluminum carbide, and titanium silicon carbide,
   wherein the fiber bundles of the first composite material layer comprise 500 to 3000 pieces of the continuous fibers of silicon carbide, each fiber having a diameter of 12 µm, and
   wherein the long fibers of the fiber bundles of the second composite material layer each have a diameter of 10 µm.

16. The continuous fiber-reinforced silicon carbide member of claim 15, wherein the fiber bundles of the second composite material layer comprise 300 pieces of the continuous fibers of carbon.

* * * * *